United States Patent
Rossi

(10) Patent No.: US 9,954,500 B2
(45) Date of Patent: *Apr. 24, 2018

(54) COMPLEMENTARY LOW NOISE TRANSDUCTOR WITH ACTIVE SINGLE ENDED TO DIFFERENTIAL SIGNAL CONVERSION

(71) Applicant: Marvell World Trade Ltd., St. Michael (BB)

(72) Inventor: Paolo Rossi, Pavia (IT)

(73) Assignee: Marvell World Trade Ltd., St. Michael (BB)

( * ) Notice: Subject to any disclaimer, the term of this patent is extended or adjusted under 35 U.S.C. 154(b) by 144 days.

This patent is subject to a terminal disclaimer.

(21) Appl. No.: 14/249,143

(22) Filed: Apr. 9, 2014

(65) Prior Publication Data

US 2014/0218114 A1    Aug. 7, 2014

Related U.S. Application Data

(63) Continuation of application No. 12/498,979, filed on Jul. 7, 2009, now Pat. No. 8,731,506.

(Continued)

(51) Int. Cl.
    *H04B 1/16*         (2006.01)
    *H03F 3/45*         (2006.01)
    (Continued)

(52) U.S. Cl.
    CPC ......... *H03F 3/45071* (2013.01); *H03F 1/223* (2013.01); *H03F 3/193* (2013.01);
    (Continued)

(58) Field of Classification Search
    CPC .......................... H04B 1/1036; H03L 2207/50
    (Continued)

(56) References Cited

U.S. PATENT DOCUMENTS 5,463,603 A * 10/1995 Petersen .......... G11B 20/10009
                                             360/61
5,604,870 A *  2/1997 Moss ................... G06F 13/105
                                             703/23

(Continued)

FOREIGN PATENT DOCUMENTS

TW        200735522 A     9/2007

OTHER PUBLICATIONS

Taiwanese Patent Application No. 098125350, Official Letter dated Dec. 25, 2014, 8 pages.

(Continued)

*Primary Examiner* — Edward Urban
*Assistant Examiner* — Rui Hu

(57) ABSTRACT

A method includes, in at least one aspect, receiving, at both an input node of a first input stage and in input node of a second input stage, a single-ended voltage signal; providing, by at least one of the first input stage or the second input stage, inductive degeneration to the single-ended voltage signal; converting an output from the first input stage into a first single-ended current signal; converting an output from the second input stage into a second single-ended current signal; and outputting, by an output stage, a differential output including the first single-ended current signal and the second single-ended current signal.

13 Claims, 6 Drawing Sheets

Related U.S. Application Data

(60) Provisional application No. 61/084,160, filed on Jul. 28, 2008.

(51) Int. Cl.
    *H03F 1/22*          (2006.01)
    *H03F 3/195*        (2006.01)
    *H03F 3/193*        (2006.01)
    *H03F 3/68*          (2006.01)

(52) U.S. Cl.
    CPC ......... *H03F 3/195* (2013.01); *H03F 3/45179* (2013.01); *H03F 3/68* (2013.01); *H03F 2200/243* (2013.01); *H03F 2200/294* (2013.01); *H03F 2200/451* (2013.01); *H03F 2200/492* (2013.01); *H03F 2200/541* (2013.01); *H03F 2203/45221* (2013.01); *H03F 2203/45681* (2013.01)

(58) Field of Classification Search
    USPC ....... 455/313, 323, 326, 333, 332, 341, 280, 455/290, 291–293, 232.1–253.2
    See application file for complete search history.

(56) References Cited

U.S. PATENT DOCUMENTS

| | | | |
|---|---|---|---|
| 6,529,721 B1* | 3/2003 | Tiller | H03D 7/1425 455/323 |
| 6,744,322 B1 | 6/2004 | Ma | |
| 7,532,055 B2* | 5/2009 | Chiu | H03D 7/1441 327/357 |
| 7,603,514 B2* | 10/2009 | Ooi | G06F 3/0607 710/5 |
| 7,671,685 B2* | 3/2010 | Chang | H03F 1/223 330/117 |
| 7,688,146 B2* | 3/2010 | Kao | H03F 1/223 330/277 |
| 7,969,222 B2* | 6/2011 | Bouras | H04B 1/30 327/307 |
| 8,175,566 B2* | 5/2012 | Tasic | H03F 3/195 330/124 R |
| 8,229,367 B2* | 7/2012 | Chan | H03F 1/565 327/563 |
| 8,526,995 B2* | 9/2013 | Ripley | H04B 1/40 330/307 |
| 8,731,506 B2* | 5/2014 | Rossi | H03F 1/223 455/290 |
| 2005/0227660 A1* | 10/2005 | Hashemi | H01Q 3/22 455/276.1 |
| 2006/0014509 A1* | 1/2006 | Xu | H03D 7/1441 455/255 |
| 2006/0135195 A1* | 6/2006 | Leinonen | H04B 1/0057 455/550.1 |
| 2006/0224792 A1* | 10/2006 | Ooi | G06F 3/0607 710/62 |
| 2007/0049205 A1* | 3/2007 | Moloudi | H03B 21/01 455/67.11 |
| 2007/0066259 A1* | 3/2007 | Ryan | H03G 3/3078 455/234.1 |
| 2007/0142019 A1* | 6/2007 | Mattisson | H03D 7/1441 455/327 |
| 2007/0146071 A1* | 6/2007 | Wu | 330/253 |
| 2007/0205829 A1* | 9/2007 | Kao | H03F 1/223 330/301 |
| 2007/0213027 A1 | 9/2007 | Rofougaran et al. | |
| 2007/0281656 A1 | 12/2007 | Rostami et al. | |
| 2008/0061860 A1* | 3/2008 | Chiu | H03D 7/1441 327/359 |
| 2008/0125072 A1* | 5/2008 | Marie | H03D 7/1433 455/318 |
| 2009/0075597 A1* | 3/2009 | Degani | H03F 1/26 455/63.1 |
| 2009/0088115 A1* | 4/2009 | Safarian | H04B 1/18 455/296 |
| 2010/0080270 A1 | 4/2010 | Chen et al. | |
| 2012/0071118 A1* | 3/2012 | Ripley | H04B 1/40 455/126 |

OTHER PUBLICATIONS

Blaakmeer et al., "An Inductorless Wideband Balun-LNA in 65nm CMOS with balanced output," *IEEE*, ISBN: 1-4244-1125-4, 364-367 (2007).

Gatta et al., "A 2-dB Noise Figure 900-MHz Differential CMOS LNA," *IEEE Journal of Solid-State Circuits*, 36(10):1444-1452 (2001).

Sahu et al., "A 90nm CMOS Single-Chip GPS Receiver with 5dBm Out-of-Band IIP3 2.0dB NF," *IEEE International Solid-State Circuits Conference*, ISBN: 0-7803-8904-2, 308-309 and 600 (2005).

\* cited by examiner

COMPLEMENTARY LOW NOISE TRANSDUCTOR WITH ACTIVE SINGLE ENDED TO DIFFERENTIAL SIGNAL CONVERSION

CROSS-REFERENCE TO RELATED APPLICATIONS

This application is a continuation application of and claims the benefit of priority to U.S. application Ser. No. 12/498,979, titled "COMPLEMENTARY LOW NOISE TRANSCONDUCTOR WITH ACTIVE SINGLE ENDED TO DIFFERENTIAL SIGNAL CONVERSION," filed on Jul. 7, 2009, which claims the benefit of priority to U.S. Provisional Application Ser. No. 61/084,160, titled "COMPLEMENTARY LOW NOISE TRANSCONDUCTOR WITH ACTIVE SINGLE ENDED TO DIFFERENTIAL SIGNAL CONVERSION," filed on Jul. 28, 2008, the disclosures of which are incorporated herein by reference in their entirety.

TECHNICAL FIELD

The subject matter of this application is generally related to wireless receivers.

BACKGROUND

Remarkable growth in the demand for wireless communications products and services, and especially in the requirements for portable wireless communications devices, has driven consumer requirements for low-cost, small-form-factor, low-power wireless (radio frequency) transceivers. In addition, the development of state-of-the-art wireless applications has encouraged consumers to expect both the convenience of extended connectivity and the benefit of enhanced services. As a result of the development, wireless transceivers that can operate in prevailing wireless standards and various geographic areas are instrumental, if not required, in the satisfaction of consumers' expectations. Due to the various standards, requirements and protocols associated with different wireless communications systems and geographic areas, not all wireless transceivers are compatible. As a result, adaptive wireless transceivers that can operate in multiple frequency modes and bands are in great demand. Additionally, such adaptive wireless transceivers are often designed to achieve maximum band coverage.

SUMMARY

Systems and methods for providing single-ended to differential signal conversion are described. A single-ended voltage signal may be received from an input of a low noise amplifier. The single-ended voltage signal may be coupled to a first input stage to match a source impedance of the single-ended voltage signal to a predetermined output impedance. The single-ended voltage signal with the predetermined output impedance may be output as a first voltage signal to a first converting stage. An input bias voltage may be provided to the first converting stage to bias the first voltage signal. The biased first voltage signal may be output as a first differential-ended current signal to an output of the low noise amplifier.

In some implementations, a device may be provided that includes: an input receiving stage to receive a single-ended voltage signal; a first converting stage to convert the single-ended voltage signal into a first single-ended current signal; a second converting stage to convert the single-ended voltage signal into a second single-ended current signal; and an output stage to output a differential output including the first single-ended current signal and the second single-ended current signal.

In some implementations, a system may be provided that includes: an antenna to receive a single-ended voltage signal; a low noise amplifier to receive the single-ended voltage signal and to convert the single-ended voltage signal into differential current signals; and one or more mixers to receive the differential current signals and to down-convert the differential current signals to recover original data.

The described systems and techniques can result in various advantages. The overall cost of adaptive wireless transceivers in wireless communications devices can be decreased. The performance of adaptive wireless transceivers, which are designed to achieve maximum band coverage, can be improved, such as by increasing their ability to reduce or remove noise and signal interferences from other bands. This can result in improved Wireless LAN (WLAN) deployments and increased suitability for use in the next-generation of multi-functional devices, such as portable or handheld devices utilizing Global Positioning System (GPS) receivers or Bluetooth® devices.

Additionally, the described systems and techniques may perform an active single-ended-to-differential conversion with active devices utilizing a common-gate common-source connection. Hence, no passive components may be needed, which may lead to a significant saving in area without incurring penalties associated with performance and power consumption.

Further, the described systems and techniques may utilize a narrow band input matching stage (e.g., using inductive degeneration) and a complementary input stage (e.g., employing PMOS (p-type metal-oxide-semiconductor field effect transistors) and/or NMOS (n-type metal-oxide-semiconductor field effect transistors) devices) to provide improved input impedance matching, optimum noise figure, high transconductance, and reduction in current consumption. Moreover, the complementary input stage may be used to remove the need of an output load (e.g., resistors or inductors) so that the described systems and techniques may be suited for current driving of subsequent processing stages (e.g., current mode passive mixers).

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Receiver Overview

For a wireless device to participate in wireless communication, the wireless device may include a built-in receiver. Depending on the medium through which the wireless signals are exchanged, the receiver may receive (or transmit if the receiver is implemented as part of a transceiver) signals of a particular type (e.g., Radio Frequency (RF) signals in a RF medium or optical signals in an optical medium). The received signals may then be demodulated (e.g., via one or more intermediate frequency (IF) stages to produce baseband or IF signals), and further processed in accordance with a particular wireless communication standard to recover the original data.

Figure 1:
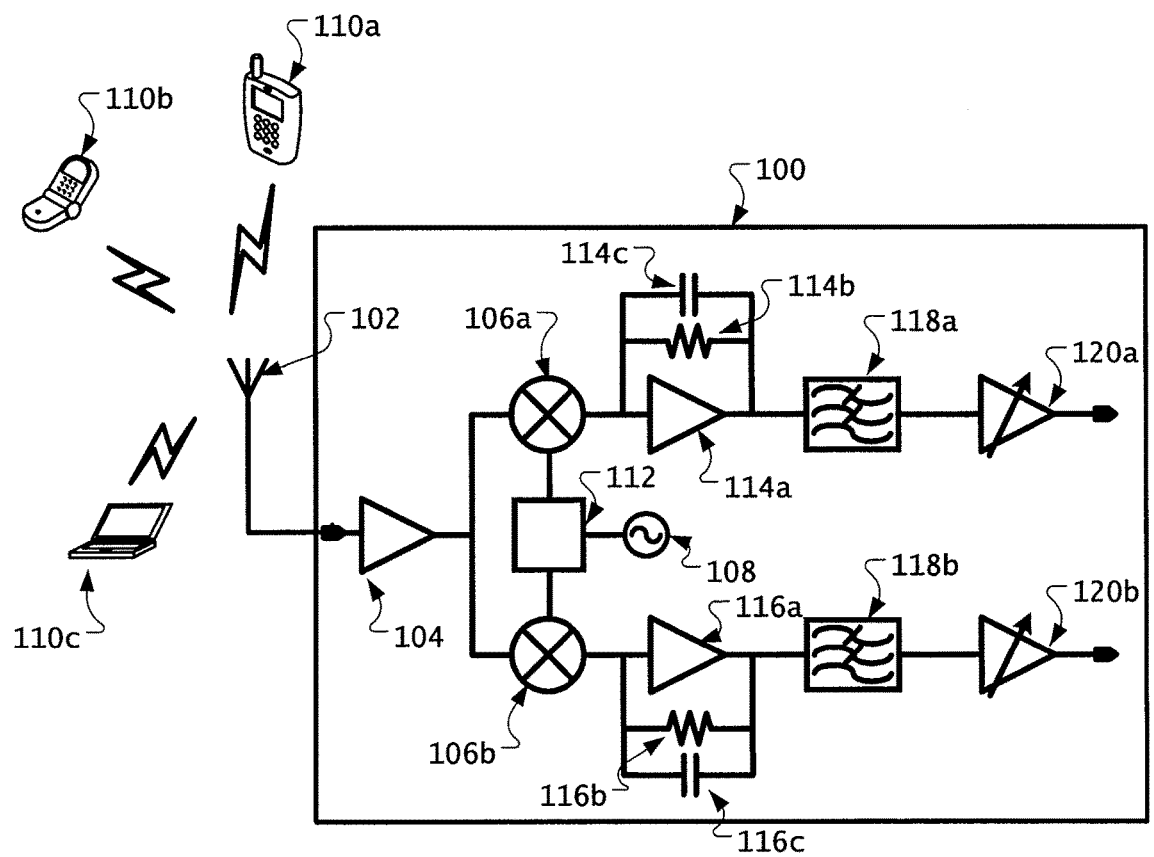
FIG. 1 shows an example of a receiver.

FIG. 1 shows an example of a receiver 100. As shown in FIG. 1, the receiver 100 may be in communication with one or more communications wireless (or wired) devices 110a, 110b, and 110c. The receiver 100 may include an antenna 102 and a low noise amplifier 104. The low noise amplifier 104 may be a self-biased CMOS circuit that amplifies an incoming signal while minimizing the additional noise introduced during the amplification process and preventing the corruption of the incoming signal associated with non-linearity.

During operation, the antenna 102 of the receiver 100 may detect and receive, for example, RF signals from the wireless communications devices 110a-110c. The antenna 102 may be a single-ended antenna that generates a single-ended input signal (e.g., a single-ended RF signal) containing data received from the wireless communications devices 110a-110c. The low noise amplifier 104 may be used to amplify the single-ended input signal, and subsequently feed the single-ended input signal to a mixing stage for signal down-conversion.

One skilled in the art would readily appreciate that the receiver 100 may be a single-ended or differential-ended structure, both in the analog and digital domain. A single-ended structure may include a terminal (e.g., input or output terminal), while a differential-ended structure may include more than one terminal (e.g., input or output terminals).

The mixing stage that receives the single-ended input signal from the low noise amplifier 104 may include a pair of passive mixers 106a/106b. In some implementations, each passive mixer 106a/106b may be implemented as a differential-ended input double-balanced mixer. In these implementations, because the input signal generated by the antenna 104 is single-ended, the single-ended input signal is converted into differential-ended signals before the passive mixers 106a/106b perform signal down conversion. While the passive mixers 106a/106b may be implemented as a single-ended to differential-ended structure, such a design may suffer from DC offset problem and even order non-linear distortion, as the passive mixers 106a/106b generally require a high level of isolation among radio frequencies, local oscillations, and intermediate frequency signals.

Accordingly, in some implementations, the low noise amplifier 104 may include a conversion circuit (as will be discussed in greater detail with respect to FIG. 3) to convert the single-ended input signal received from the antenna 102 to a differential-ended signal. For example, the low noise amplifier 104 may amplify the single-ended input signal, and the conversion circuit then may convert the amplified single-ended input signal into a differential-ended output signal to be processed by the passive mixers 106a/106b for down-conversion. As will be discussed in greater detail below, the differential-ended output signal generated by the conversion circuit may include a differential-ended output current to drive the passive mixers 106a/106b.

In some implementations, the passive mixer 106a may be an I-path mixer and the passive mixer 106b may be an Q-path mixer. Alternatively, the passive mixer 106a may be an Q-path mixer and the passive mixer 106b may be an I-path mixer. To down-convert the differential-ended output signal, each of the passive mixers 106a/106b may receive a reference oscillation signal. In general, the I-Q mixers 106a/106b may be driven by two phases of the same oscillator, with 90° of relative phase. The I-Q mixers 106a/106b may be quadrature down-converters such that the local oscillator signals have a 90° phase shift. The local oscillator signals or reference oscillation signals may be provided by an oscillator 108. If desired, each passive mixer 106a/106b may receive a reference oscillation signal from a different oscillator.

In some implementations, a quadrature local oscillator signal may be derived (e.g., from a local oscillator signal) for driving the I-Q mixers 106a/106b. A frequency divider 112 driven by a double frequency local oscillator signal may be used. The divider 112 may be used to divide the local oscillator signal frequency and generate I and Q phases for the I-Q mixers 106a/106b. For example, the divider 112 may be a ½ divider configured to divide the reference oscillation signal into two oscillation signals both having the same frequency but different phase (e.g., separated by a phase difference of 90°).

Subsequently, the differential-ended output signal may be down-converted by the passive mixers 106a/106b (e.g., by mixing the differential-ended output signal with the oscillation signal generated by the oscillator 108). The down-converted signal may further be amplified by transimpedance amplifiers 114a/116a. Each transimpedance amplifier 114a/116a may include a feedback resistor 114b/116b that connects the output to the input of the transimpedance amplifier 114a/116a. In some implementations, the feedback resistor 114b/116b may be used where the gain of the transimpedance amplifier 114a/116a may be high so as to allow all of the current to pass through the feedback resistor 114b/116b. A feedback capacitor 114c/116c also may be optionally used to provide stability and bandwidth.

The resulting voltage signal, in some implementations, may be filtered by a filtering stage that may include filters 118a/118b. Filters 118a/118b may be operable to attenuate unwanted interference or blocker in the voltage signal. The filtered signal may subsequently be processed by downstream processing modules that may include, without limitation, variable gain amplifiers (VGA) 120a/120b, digital processors (e.g., to decode, descramble, demap, and/or demodulate), analog-to-digital converters and a data recovery stage to recover the original data in accordance with a particular wireless communication standard or protocol.

In some implementations, the low noise amplifier 104 may be controlled, for example, by a baseband processor. The baseband processor may include suitable logic, circuitry, and programming code that may be adapted to process baseband signals received by the receiver 100. The baseband processor also may include one or more microprocessors that may be utilized to monitor and control various programmable parameters and values associated with the components and processing elements in the receiver 100 and the baseband processor.

The baseband processor also may receive other control and data information from other wireless communications devices (e.g., devices 110a-110c) connected to the receiver 100. The baseband processor may utilize the received control or data information to determine an operating mode of the receiver 100. For example, based on the received control data, the baseband processor may select a specific gain for the low noise amplifier 104, configure the oscillation frequency of the oscillator 108, configure the low noise amplifier 104 for operation in accordance with various communication standards and protocols, and the like.

In some implementations, an impedance network may be used to match the input impedance between the antenna 102 and the receiver 100 to ensure maximum power transfer and minimize power loss (e.g., at an operating frequency). As an example, the antenna 102 may have a 50Ω impedance at an operating frequency, and an impedance network may be used to correspondingly match the input impedance of the receiver 100 at the same frequency (e.g., at 50Ω).

One skilled in the art would readily recognize that the receiver 100 may be implemented using one or more integrated circuits, and the one or more integrated circuits may be implemented on a same or different chip or die. As another example, the receiver 100 and the baseband processor may be a common processing device implemented on a single integrated circuit.

Low Noise Amplifier Implemented with a Passive Balun

Figure 2:
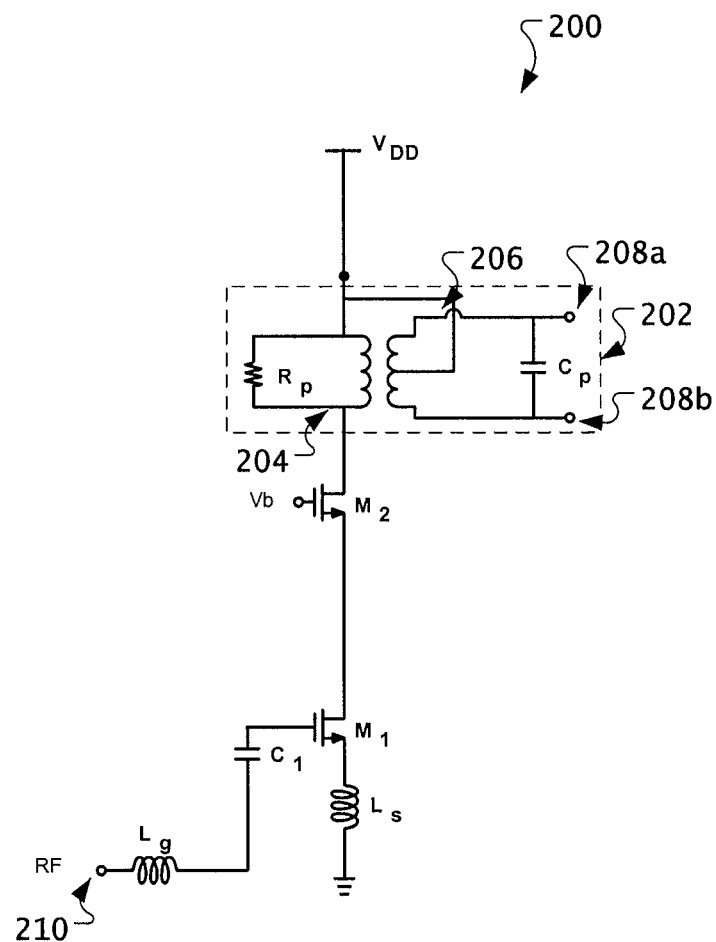
FIG. 2 shows an example of a low noise amplifier with a balun.

FIG. 2 shows an example of a low noise amplifier 200 with a balun. As shown in FIG. 2, the low noise amplifier 200 may include a balun 202. In some implementations, the balun 202 may be a balanced/unbalanced transformer. For example, the balun 202 may convert an unbalanced signal to a balanced signal, or convert a balanced signal to an unbalanced signal. The balun 202 also may be operable to convert the single-ended input signal (e.g., received through an RF input 210) into a differential-ended signal at the outputs 208a/208b. Specifically, the primary winding 204 of the balun 202 may be coupled with the RF input 210 while the secondary winding 206 may be center tapped to produce the differential-ended signal at the outputs 208a/208b from the single-ended input signal received through the RF input 210. For example, a signal having a phase difference equivalent to 180° is generated from both the primary winding 204 and the secondary winding 206 to amplify the signal and generate a high frequency signal at each output 208a and 208b.

The balun 202 may include additional passive or active devices. However, when the balun 202 includes passive devices, the size of the passive balun 202 can become large, and therefore, it may be difficult to integrate the balun 202 onto a single chip. Additionally, the passive balun 202 may not only increase cost of implementing a low noise amplifier but also increase the noise figure of the receiver 100 since the increase of the noise figure is generated from the power loss of the balun 202. Noise generated by the passive balun 202 can decrease the signal-to-noise ratio, and can degrade the overall performance of the low noise amplifier 200. Further, the passive balun 202 is not compatible with the current technology associated with scaling and die cost minimization, making the use of the passive balun 202 undesirable.

Figure 3:
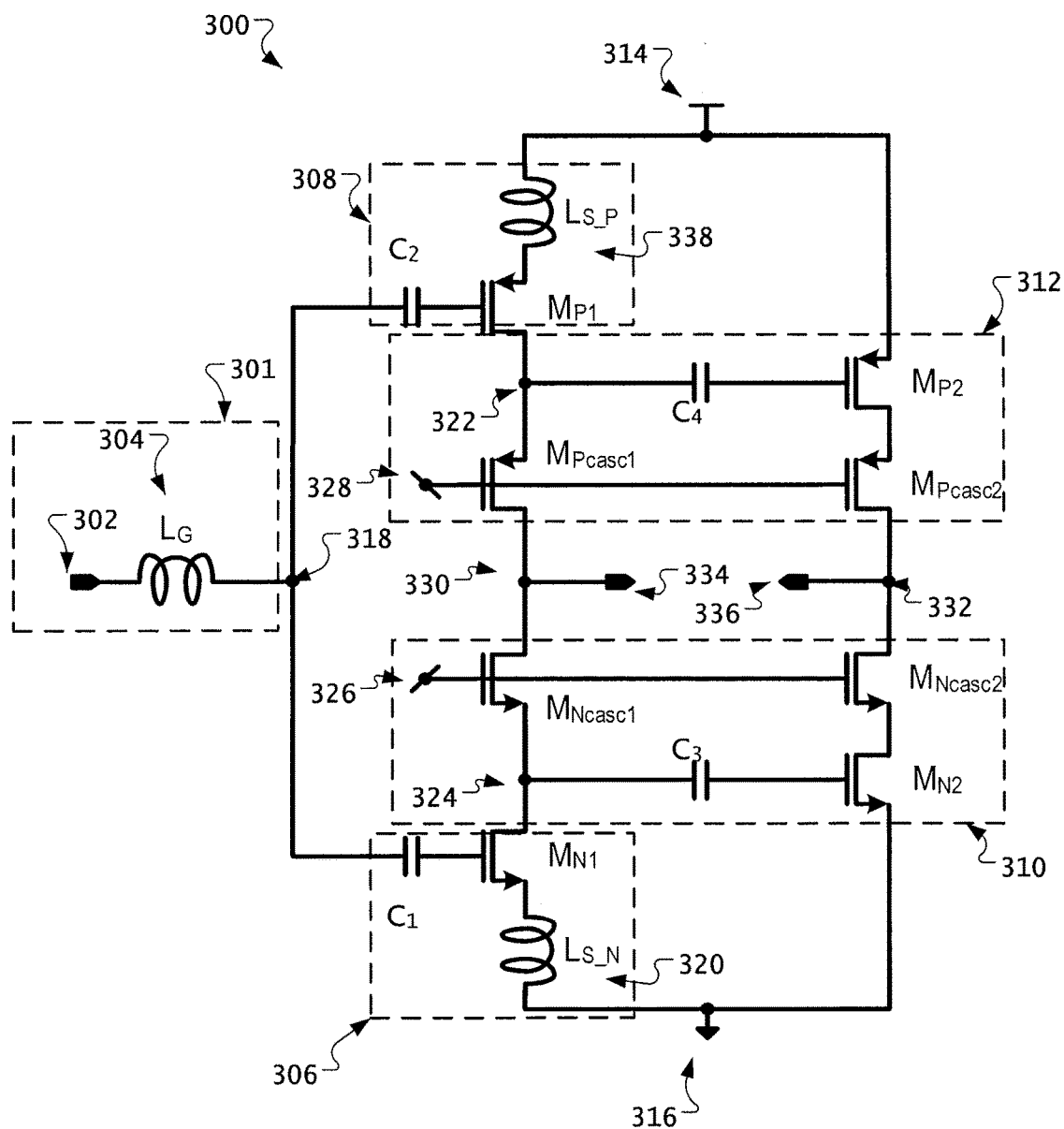
FIG. 3 shows an example of a complementary low noise amplifier.

Complementary Low Noise Transconductor with Active Single Ended to Differential Signal Conversion Thus, in some implementations, a complementary low noise amplifier 300 may be used in place of the low noise amplifier 200 in the receiver 100. FIG. 3 shows an example of a complementary low noise amplifier 300. As will be discussed in greater detail below, the complementary low noise amplifier 300 may be used without a passive balun, and may achieve high gain, low noise figure (e.g., less than 3 dB), and high linearity even at low power supply.

As shown in FIG. 3, the complementary low noise amplifier 300 may include one or more complementary stages. In some implementations, the low noise amplifier 300 may include an input receiving stage 301. The input receiving stage 301 may include an input 302 (e.g., an RF input) to receive a single-ended input signal (e.g., a single-ended RF signal) and a first inductor $L_G$ 304. The input 302 may be coupled with one end of a first inductor $L_G$ 304, and a first input stage 306 and a second input stage 308 may be coupled to the other end of the first inductor $L_G$ 304. The first input stage 306 may be coupled to a single-ended to differential current conversion stage. The single-ended to differential current conversion stage may include a first converting stage 310 and a second converting stage 312. The first input stage 306 and the second input stage 308 may be coupled with one end of a first inductor $L_G$ 304 having a predetermined transconductance.

As will be discussed in greater detail below, the first input stage 306 and the second input stage 308 may be used to convert an incoming single-ended voltage signal into a single ended current signal, and the first converting stage 310 and the second converting stage 312 may be used to convert the single-ended current signal into a pair of differential signals.

The first input stage 306 may include a first MOSFET (Metal Oxide Semiconductor Field-Effect Transistor) transistor $M_{N1}$, a capacitor $C_1$, and a second inductor $L_{S\_N}$. The capacitor $C_1$ may be coupled between the first inductor $L_G$ 304 and the gate of the transistor $M_{N1}$. In some implementations, the capacitor $C_1$ may be an AC coupling capacitor.

The source of the transistor $M_{N1}$ may be connected to the second inductor $L_{S\_N}$ 320, while the drain of the transistor $M_{N1}$ may be connected to the source of a first cascaded transistor $M_{NCASC1}$ and the capacitor $C_3$ (e.g., via node 324). While one end of the second inductor $L_{S\_N}$ 320 may be coupled with the source of the transistor $M_{N1}$, the other end of the second inductor $L_{S\_N}$ 320 may be connected to a ground $V_{SS}$ 316 (and the source of a transistor $M_{N2}$).

In some implementations, the capacitor $C_3$ may be used to provide high frequency coupling between the node 324 and the gate of transistor $M_{N2}$. Where high frequency coupling is provided between the node 324 and the gate of transistor $M_{N2}$, the DC voltage at the gate of the transistor $M_{N2}$ is not forced to be the DC voltage at the node 324, which translates into greater flexibility in the design of the first converting stage 310.

In some implementations, the first input stage 306 may be used as an impedance matching network. For example, the first inductor $L_G$ 304, the second inductor $L_{S\_N}$ 320, the transistor $M_{N1}$, and the capacitor $C_1$ connected to the gate of the transistor $M_{N1}$ may allow for a 50Ω impedance match to the input 302 (e.g., an input connecting to antenna 102 shown in FIG. 1) at a frequency band of interest. The first input stage 306 also may be used to minimize the input stage noise figure (e.g., <1.0 dB). For example, source degeneration inductance may be provided through the second inductor $L_{S\_N}$ 320 to present a 50Ω input resistance without adding resistive thermal noise. Additionally, the first input stage 306 may provide high reactive amplification of the input stage transconductance.

In general, the input impedance of the complementary low noise amplifier 300 may depend on the inductance of the second inductor $L_{S\_N}$ 320, the inductance of the first inductor $L_G$ 304, the transconductance and the gate-to-source capacitance of the transistor $M_{N1}$. At a particular resonant operating frequency, the inductance of the second inductor $L_{S\_N}$ 320 may be selectively chosen to provide a desired real input resistance that may be adapted for input impedance matching of the complementary low noise amplifier 300. The first inductor $L_G$ 304 also may be chosen to null (e.g., by resonating out) the capacitive portion (e.g., the gate-source capacitance $C_{gs}$) of the transistor $M_{N1}$.

Similarly, the second input stage 308 may include a transistor $M_{P1}$ and a capacitor $C_2$. Specifically, one end of the capacitor $C_2$ may be coupled with the first inductor $L_G$ 304 (e.g., via node 318), while the other end of the capacitor $C_2$ may be coupled with the gate of the transistor $M_{P1}$. The source of the transistor $M_{P1}$ may be coupled with the supply voltage $V_{DD}$ 314, and the drain of the transistor $M_{P1}$ may be coupled with the second converting stage 312 (e.g., via node 322).

In some implementations, degeneration may be employed with respect to the first input stage 306 and the second input stage 308. For example, as shown in FIG. 3, the inductor $L_{S\_N}$ 320 of the first input stage 306 and the inductor $L_{S\_P}$ 338 of the second input stage 308 may function as degenerate inductors to provide inductive degeneration to the incoming single ended signal.

In other implementations, only one of the first input stage 306 and the second input stage 308 may provide inductive degeneration to the incoming single ended signal. For example, the second input stage 308 need not include the inductor $L_{S\_P}$ 338 (e.g., at the source or at the gate of the transistor $M_{P1}$). In these implementations, the second input stage 308 may function to reduce the power consumption of the complementary low noise amplifier 300 (e.g., since degeneration is not needed in the second input stage 308) within a given gain and linearity. As another example, the second input stage 308 may provide inductive degeneration through the inductor $L_{S\_P}$ 338 and the first input stage 306 need not include the inductor $L_{S\_N}$ 320.

Where degeneration is used, the second input stage 308, at resonance, may exhibit a real part of an input impedance that is in parallel to that exhibited by the first input stage 306. Where degeneration is omitted, the second input stage 308 may be seen as a capacitor whose capacitive effect may be cancelled out at resonance frequency. Additionally, removing the degeneration on the first input stage 306 or the second input stage 308 can help reduce the area of the low noise amplifier 300. In general, the second input stage 308 (degenerated or not degenerated) may be used to increase the overall gain of the low noise amplifier 300 because the current gain (transconductance) associated with the second input stage 308 is added in parallel to the current gain associated with the first input stage 306.

Additionally, the bias current may be re-used so as to further maximize the transconductance of the complementary low noise amplifier 300 while minimizing the noise figure for a given current consumption. For example, the second input stage 308 may utilize the same DC current as the one used by the first input stage 306. In so doing, the first input stage 306 and the second input stage 308 may be biased with the same bias current to allow for current reuse.

In some implementations, the first converting stage 310 may include a first cascaded transistor $M_{NCASC1}$, a second cascaded transistor $M_{NCASC2}$ and a transistor $M_{N2}$. In some implementations, a common-gate, common-source scheme may be established in which the first cascaded transistor $M_{NCASC1}$ may be used as a common-gate transistor, while the transistor $M_{N2}$ may be used as a common-source transistor. The source of the second cascaded transistor $M_{NCASC2}$ may be coupled with the drain of the transistor $M_{N2}$. The source of the transistor $M_{N2}$ may be coupled with the ground $V_{SS}$ 316, while the gate of the transistor $M_{N2}$ may be coupled with one end of the capacitor $C_3$. The other end of the capacitor $C_3$ may be coupled with a node 324 that connects with the source of the first cascaded transistor $M_{NCASC1}$ and the drain of the transistor $M_{N1}$.

In some implementations, the gate of the first cascaded transistor $M_{NCASC1}$ may be tied to the gate of the second cascaded transistor $M_{NCASC2}$ for biasing purposes. In these implementations, both the gate of the first cascaded transistor $M_{NCASC1}$ and the gate of the second cascaded transistor $M_{NCASC2}$ may be driven by a bias voltage provided through the node 326. The bias voltage 326 may be fixed or variable.

Based on the bias voltage, the first cascaded transistor $M_{NCASC1}$ of the first converting stage 310 may convert the bias voltage into a first current that flows to node 330. The output current at the output node 334 may be a product of the current passing through the first cascaded transistor $M_{NCASC1}$ of the first converting stage 310 and the transistor $M_{N1}$ of the first input stage 306.

Similarly, the second cascaded transistor $M_{NCASC2}$ also may convert the bias voltage into a second current that flows to node 332. The output current at the output node 336 may be a product of the current passing through the second cascaded transistor $M_{NCASC2}$ and the transistor $M_{N2}$. In some implementations, the signal output current at the output node 336 may be dependent (e.g., only) upon the transconductance gain of the transistor $M_{N2}$. The total current at the output nodes 334/336 may then be defined as the sum of the current produced by the first converting stage 310 and the second converting stage 312.

The second converting stage 312 may be coupled with the second input stage 308 and the first converting stage 310. Similar to the first converting stage 310, the second converting stage 312, in some implementations, may utilize a common-gate, common-source configuration so that the gain linearity of the low noise amplifier 300 may further be improved.

The second converting stage 312 may include a first cascaded transistor $M_{PCASC1}$, a second cascaded transistor $M_{PCASC2}$, and a transistor $M_{P2}$. The gate of the first cascaded transistor $M_{PCASC1}$ may be tied to the gate of the second cascaded transistor $M_{PCASC2}$. Both the gate of the first cascaded transistor $M_{PCASC1}$ and the gate of the second cascaded transistor $M_{PCASC2}$ may be driven by a bias voltage supplied through the node 328. The bias voltage may be a fixed or variable voltage. In some implementations, the bias voltage supplied through the node 328 may be used to control the impedance (and hence output current passage) at node 330 and node 332.

The source of the second cascaded transistor $M_{PCASC2}$ may be coupled with the drain of the transistor $M_{P2}$. The source of the transistor $M_{P2}$ may be coupled with the supply voltage $V_{DD}$ 314, while the gate of the transistor $M_{P2}$ may be coupled with one end of the capacitor $C_4$. The other end of the capacitor $C_4$ may be coupled with the node 322 that connects with the source of the first cascaded transistor $M_{PCASC1}$ and the drain of the transistor $M_{P1}$.

The first cascaded transistor $M_{PCASC1}$ of the second converting stage 312 may convert the bias voltage at the node 328 into a current that flows to the node 330. In addition to the current passing through the first cascaded transistor $M_{NCASC1}$ of the first converting stage 310 and the transistor $M_{N1}$ of the first input stage 306, the output current at the output node 330 also may be a product of the current passing through the first cascaded transistor $M_{PCASC1}$ of the second converting stage 312 and the transistor $M_{P1}$ of the second input stage 308.

As discussed above, the total current at the output nodes 334/336 may be the sum of the current produced by the first converting stage 310 and the second converting stage 312. By combining the current produced by the first converting stage 310 and the second converting stage 312, the current gain at the output for a specific current consumption may be maximized. The output currents at nodes 334 and 336 may then be used to drive the following stage of receiver components (e.g., passive mixers 106a/106b shown in FIG. 1).

In some implementations, the transistor $M_{N1}$ of the first input stage 306, the first cascaded transistor $M_{NCASC1}$, the second cascaded transistor $M_{NCASC2}$, and the transistor $M_{N2}$ of the first converting stage 310 may be a N-type MOSFET device, while the transistor $M_{P1}$ of the second input stage 308, the first cascaded transistor $M_{PCASC1}$, the second cascaded transistor $M_{PCASC2}$, and the transistor $M_{P2}$ of the second converting stage 312 may be a P-type MOSFET device. By using N-type devices in the first input stage 306 and the first converting stage 310 and P-type MOSFET devices in the second input stage 308 and the second converting stage 312, the low noise amplifier 300 may provide improved matching characteristic. Further, when MOSFET devices are used, N-type and P-type devices may be manufactured on a single die or chip to further achieve a single-chip receiver.

Additionally, where the first converting stage 310 and the second converting stage 312 utilize a common-gate, common-source configuration, the high frequency matching of the noise figure and the gain of the low noise amplifier 300 may be more precise than the conventional low noise amplifiers, and the design complexity of the low noise amplifier 300 also may be less than the conventional low noise amplifiers. For example, neglecting effects due to finite output resistance may allow the impedance $Z_P$ at the node 324 of the first converting stage 310 to be characterized as shown in equation [1]:

$$Z_P = 1/g_{m\_MNcasc2} \quad [1]$$

where $g_{m\_MNcasc2}$ denotes the transconductance of the second cascaded transistor $M_{NCASC2}$. Assuming that the signal current flowing into the drain of the transistor $M_{N1}$ of the first input stage 306 is defined as $I_{in+}$ and the signal current flowing out of the drain of the second cascaded transistor $M_{NCASC2}$ of the first converting stage 310 is defined as $I_{in-}$, then the current gain balance between $I_{in-}$ and $I_{in+}$ of the first converting stage 310 may be defined as shown in equation [2]:

$$I_{in-} = I_{in+} \cdot \text{mod}(g_{m\_MN2}/g_{m\_MNcasc2}) \quad [2]$$

From [2], a common-gate, common-source transconductance stage can achieve a desired signal current gain balance by setting $I_{in-}$ and $I_{in+}$ equal, such that the transconductance relationship between the transconductance of the second cascaded transistor $M_{NCASC2}$ and the transistor $M_{N2}$ may be given as shown in equation [3]:

$$g_{m\_MN2} = g_{m\_MNcasc2} \quad [3]$$

Accordingly, the first converting stage 310 may achieve a maximum current gain balance by setting the transconductance of the second cascaded transistor $M_{NCASC2}$ and the transistor $M_{N2}$ equal.

In sum, the low noise amplifier 300 may provide an active single-ended-to-differential conversion by using actives devices operating in a common-gate, common-source scheme. Unlike conventional low noise amplifiers, the low noise amplifier 300 need not include passive components (e.g., balun). As a result, significant area reduction may be saved without incurring any signal penalty in terms of performance and power consumption. Further, because the low noise amplifier 300 may utilize inductive degeneration (e.g., via second inductor $L_{S\_N}$ 320) together with complementary input stages (e.g., the first input stage 306 and the first converting stage 310, and the second input stage 308 and the second converting stage 312), precise matching in input impedance, optimum reduction in noise figure and minimal in current consumption, high transconductance and maximum current gain can be achieved by an on-chip receiver. Further, the complementary input stages may remove the need of an output load (e.g., resistors or inductors) so that the low noise amplifier 300 is also suited for current driving any passive devices of one or more subsequent stages (e.g., current mode passive mixers).

The receiver 100 may be used in conjunction with various devices and systems, for example, a personal computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a non-mobile or non-portable device, a wireless communication station, a wireless communication device, a wireless Access Point (AP), a wired or wireless router, a wired or wireless modem, a wired or wireless network, a Local Area Network (LAN), a Wireless LAN (WLAN), a Metropolitan Area Network (MAN), a Wireless MAN (WMAN), a Wide Area Network (WAN), a Wireless WAN (WWAN), a Personal Area Network (PAN), a Wireless PAN (WPAN), devices and/or networks operating in accordance with IEEE 802 standards, one way and/or two-way radio communication systems, cellular, radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, a wired or wireless handheld device (e.g. BlackBerry®, Palm Treo®), a Wireless Application Protocol (WAP) device, or the like.

The receiver 100 (or the low noise amplifier 200) also may be used in conjunction with one or more types of wireless communication signals and/or systems, for example, Radio Frequency (RF), Frequency-Division Multiplexing (FDM). Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, Multi-Carrier Modulation (MDM), Discrete Multi-Tone (DMT), Bluetooth®, GPS, Wi-Fi, Wi-Max, Ultra-Wideband (UWB), Global System for Mobile communication (GSM), 2G, 2.5G, 3G, 3.5G, or the like.

Similarly, the low noise amplifier 300 is applicable in the context of digital or analog transmitters or receivers that may be adapted for compliance with a particular wireless communications standard such as, without limitation, GSM, Bluetooth®, WLAN, and the like. One skilled in the art would also appreciate that the low noise amplifier 300 is not limited for use with any particular communication standard or circuit, and may be used, for example, in optical, wired, wireless and control system applications. The low noise amplifier 300 also may be applicable in situations where the receiver 100 is implemented as an off-chip device.

Figure 4:
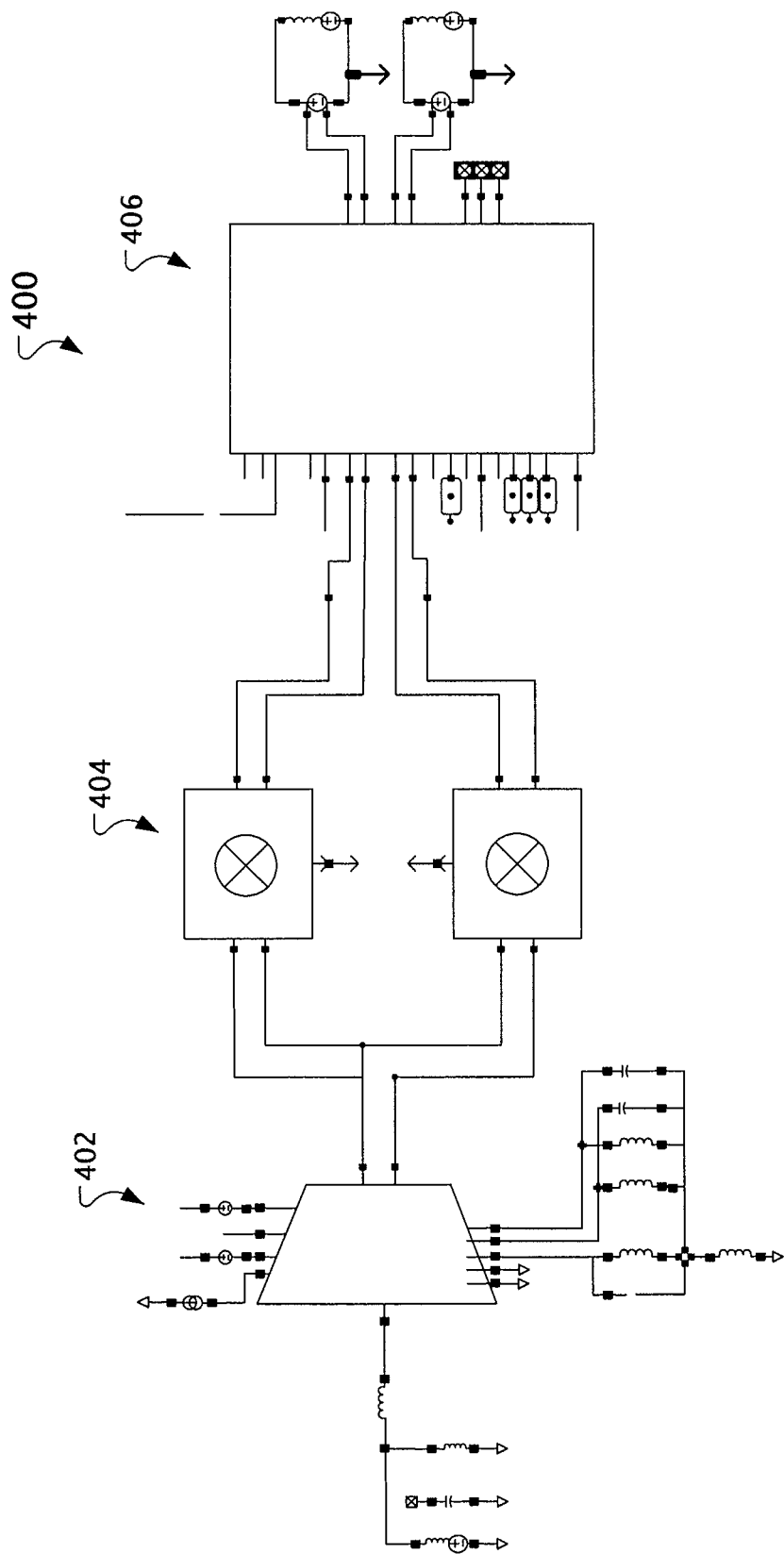
FIG. 4 shows an exemplary schematic of a receiver.
Figure 5:
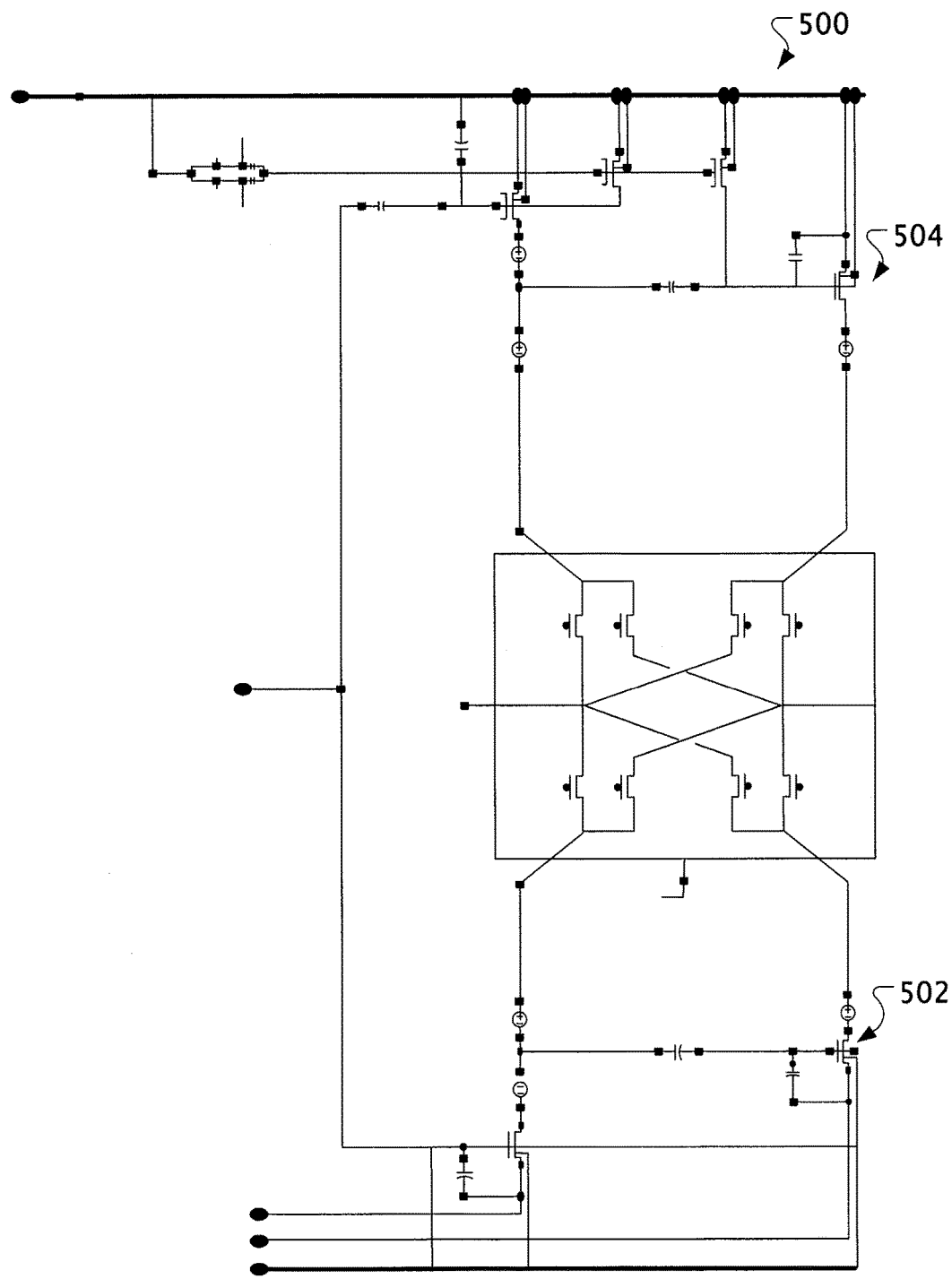
FIG. 5 shows an exemplary schematic of a low noise amplifier.

FIG. 4 shows an exemplary schematic of a receiver 400. As shown in FIG. 4, the receiver 400 may include a low noise amplifying stage 402, a mixing stage 404 and a transimpedance amplifier 406. FIG. 5 shows an exemplary schematic of a low noise amplifier 500. As shown in FIG. 5, the low noise amplifier 500 includes a NMOS transconductance stage 502 and a PMOS transconductance stage 504.

Figure 6:
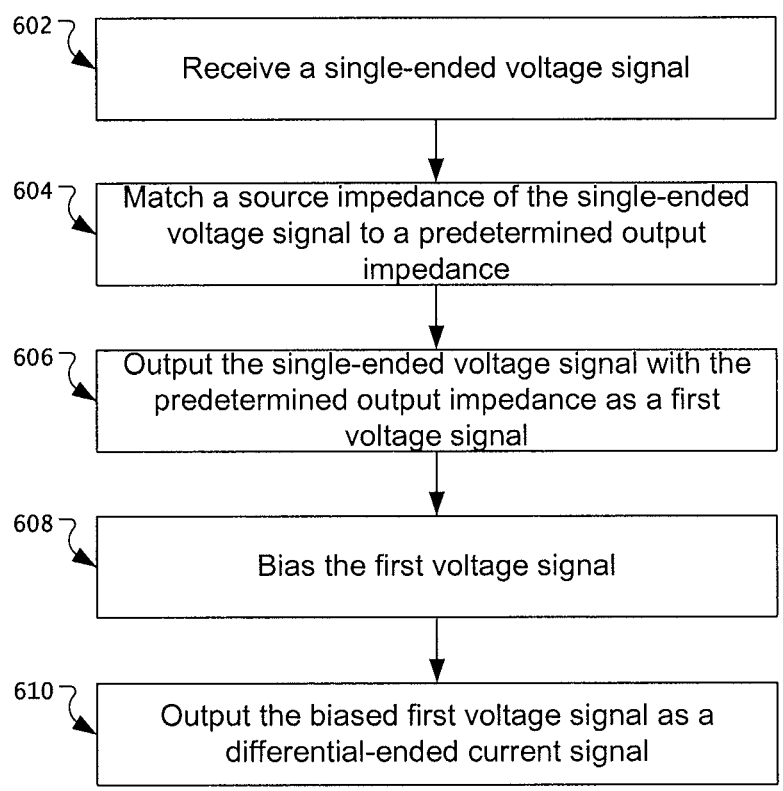
FIG. 6 shows an example of a process for converting a single-ended signal into a differential signal.

FIG. 6 is an example of a process for converting a single-ended signal into a differential signal. The process 600 may be performed, for example, by the low noise amplifier 200, and for clarity of presentation, the description that follows uses the low noise amplifier 200 as the basis of examples for describing the process 600. However, another system, or combination of systems, may be used to perform the process 600.

Process 600 begins with receiving a single-ended voltage signal from an input of a low noise amplifier (602). The single-ended voltage signal may be coupled to a first input stage to match a source impedance of the single-ended voltage signal to a predetermined output impedance (604). The single-ended voltage signal with the predetermined output impedance may be output as a first voltage signal to a first transconductance stage (606). An input bias voltage may be provided to the first transconductance stage to bias the first voltage signal (608). The biased first voltage signal may be output as a first differential-ended current signal to an output of the low noise amplifier (610).

In some implementations, the single-ended voltage signal also may be coupled to a second input stage to maximize a linearized gain associated with the single-ended voltage signal. The single-ended voltage signal with the maximized gain may be output as a second voltage signal to a second transconductance stage. An input bias voltage may be provided to the second transconductance stage to bias the second voltage signal. The biased second voltage signal may be output as a second differential-ended current signal to the output of the low noise amplifier.

In some implementations, operations 602-610 may be performed in the order listed or in parallel (e.g., by the same or a different process, substantially or otherwise non-serially) to achieve the same result. In other implementations, operations 602-610 may be performed out of the order shown. Operations 602-610 also may be performed by the same or different entities or systems.

As may be used herein, the term "substantially" or "approximately" indicates an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. Also, the phrases "operably coupled," "coupled with," or "coupled to," as may be used herein, includes direct coupling and indirect coupling via another component, element, circuit, or module where, for indirect coupling, the intervening component, element, circuit, or module does not modify the information of a signal but may adjust its current level, voltage level, and/or power level. Furthermore, inferred coupling (e.g., where one element is coupled with another element by inference) includes direct and indirect coupling between two elements in the same manner as "operably coupled." Finally, the term "compares," as may be used herein, indicates that a comparison between two or more elements, items, signals, etc., provides a desired relationship.

What is claimed is:

1. A method comprising:
   receiving, at both an input node of a first input stage and an input node of a second input stage, a single-ended voltage signal;
   providing, by at least one of the first input stage or the second input stage, inductive degeneration to the single-ended voltage signal;
   converting an output from the first input stage into a first single-ended current signal, the first single-ended current signal having a first current level that is dependent upon a first transconductance gain of the first input stage;
   converting an output from the second input stage into a second single-ended current signal, the second single-ended current signal having a second current level that is dependent upon a second transconductance gain biased by the output of the first input stage; and
   outputting, by an output stage, a differential output including the first single-ended current signal and the second single-ended current signal, wherein the first input stage, the second input stage, and the output stage are included in a low noise amplifier.

2. The method of claim 1, wherein converting the output from the first input stage into the first single-ended current signal comprises:
   converting, by the first input stage and a first converting stage, the single-ended voltage signal into the first single-ended current signal.

3. The method of claim 1, further comprising:
   providing, by the first input stage, impedance matching to the single-ended voltage signal.

4. The method of claim 1, further comprising:
   receiving, by a first converting stage, a bias voltage for biasing the single-ended voltage signal.

5. The method of claim 1, wherein converting the output from the second input stage into the second single-ended current signal comprises:
   converting, by the second input stage and a second converting stage, the single-ended voltage signal into the second single-ended current signal.

6. The method of claim 1, further comprising:
   providing, by the second input stage, a real part of an input impedance for impedance matching the single-ended voltage signal.

7. The method of claim 1, further comprising:
   receiving, by a second converting stage, a bias voltage for biasing the single-ended voltage signal.

8. An apparatus comprising:
   a first input stage that receives a single-ended voltage signal and provides inductive degeneration to the single-ended voltage signal;
   a second input stage that receives the single-ended voltage signal, the second input stage being complementary to the first input stage and having an input node connected to an input node of the first input stage; and
   a single-ended to differential conversion stage coupled to the first input stage and the second input stage, the single-ended to differential conversion stage converts an output from the first input stage into a first single-ended current signal having a first current level that is dependent upon a first transconductance gain of the first input stage, converts an output from the second input stage into a second single-ended current signal having a second current level that is dependent upon a second transconductance gain biased by the output of the first input stage, and outputs a differential output including the first single-ended current signal and the second single-ended current signal, wherein the first input stage, the second input stage, and the single-ended to differential conversion stage are included in a low noise amplifier.

9. The apparatus of claim 8, wherein the first input stage provides impedance matching to the single-ended voltage signal.

10. The apparatus of claim 8, wherein the first input stage minimizes a noise figure associated with the single-ended voltage signal.

11. The apparatus of claim 8, wherein the first input stage provides reactive amplification of the first transconductance gain.

12. The apparatus of claim 8, wherein the first input stage and the second input stage are biased with a same bias current.

13. The apparatus of claim 8, wherein the single-ended to differential conversion stage comprises active devices connected in a common-gate, common-source configuration.

* * * * *